US011393307B2

(12) United States Patent
Molchadsky

(10) Patent No.: US 11,393,307 B2
(45) Date of Patent: Jul. 19, 2022

(54) INTEGRATED BATTERY MONITORING CIRCUIT

(71) Applicant: GALOOLI LTD., Tel-Aviv (IL)

(72) Inventor: Itamar Molchadsky, Sede Warburg (IL)

(73) Assignee: GALOOLI LTD., Tel-Aviv (IL)

( * ) Notice: Subject to any disclaimer, the term of this patent is extended or adjusted under 35 U.S.C. 154(b) by 0 days.

(21) Appl. No.: 16/491,175

(22) PCT Filed: Feb. 24, 2019

(86) PCT No.: PCT/IL2019/050205
§ 371 (c)(1),
(2) Date: Sep. 5, 2019

(87) PCT Pub. No.: WO2020/170234
PCT Pub. Date: Aug. 27, 2020

(65) Prior Publication Data
US 2021/0005066 A1    Jan. 7, 2021

(51) Int. Cl.
*G01R 31/36*     (2020.01)
*G08B 13/14*     (2006.01)
*G01R 31/389*    (2019.01)
*G01R 31/367*    (2019.01)

(52) U.S. Cl.
CPC ......... *G08B 13/1409* (2013.01); *G01R 31/36* (2013.01); *G01R 31/367* (2019.01); *G01R 31/389* (2019.01)

(58) Field of Classification Search
CPC .... G01R 31/36; G01R 31/371; G01R 31/382; G01R 31/389; H02J 7/0048; G08B 13/2462
See application file for complete search history.

(56) References Cited

U.S. PATENT DOCUMENTS

| | | | |
|---|---|---|---|
| 7,024,321 B1 | 4/2006 | Deninger et al. | |
| 7,459,822 B1 | 12/2008 | Morgan | |
| 7,619,417 B2 | 11/2009 | Klang | |
| 9,142,992 B2 | 9/2015 | Malackowski et al. | |

(Continued)

FOREIGN PATENT DOCUMENTS

| | | |
|---|---|---|
| CN | 202976361 U | 6/2013 |
| CN | 105098266 A | 11/2015 |

*Primary Examiner* — Benyam Haile
(74) *Attorney, Agent, or Firm* — Pearl Cohen Zedek Latzer Baratz LLP

(57) ABSTRACT

A monitoring circuit configured to be installed within a rechargeable battery, wherein the monitoring circuit is initially configured to function in a storage mode and consume minimal current, wherein the monitoring circuit in storage mode is configured to identify if the rechargeable battery is deployed in a consumer system, then the monitoring circuit changes to a consumer mode in which the monitoring circuit samples the status of the rechargeable battery based on a sensor and/or a global positioning chip, records information of sampling the status in the memory and periodically communicates with a server to transmit the recorded information and receive instructions from the server, wherein in consumer mode if the processor identifies an abnormal event the monitoring circuit changes to function in a movement mode in which it continuously communicates the location of the monitoring circuit to the server.

20 Claims, 3 Drawing Sheets

(56) References Cited

U.S. PATENT DOCUMENTS

| | | |
|---|---|---|
| 2002/0177476 A1 | 11/2002 | Chou |
| 2005/0029986 A1 | 2/2005 | Morgan |
| 2012/0299721 A1* | 11/2012 | Jones ................ H04Q 9/00 340/521 |
| 2014/0285156 A1* | 9/2014 | Mukaitani ............ G01R 31/392 320/134 |
| 2014/0292344 A1 | 10/2014 | Le Neel et al. |
| 2016/0161367 A1* | 6/2016 | Chu .................... G01M 15/02 324/433 |
| 2017/0062878 A1 | 3/2017 | Povey et al. |
| 2018/0040224 A1 | 2/2018 | Barcala et al. |
| 2018/0375349 A1* | 12/2018 | Bonilla .................. H02J 50/80 |
| 2019/0027002 A1 | 1/2019 | Esenwein et al. |
| 2019/0057586 A1 | 2/2019 | Kangralkar et al. |
| 2019/0237814 A1* | 8/2019 | Waters ............. H01M 10/4207 |

* cited by examiner

INTEGRATED BATTERY MONITORING CIRCUIT

TECHNICAL FIELD

The present disclosure relates generally to rechargeable batteries and more particularly to a monitoring circuit embedded within a rechargeable battery, which also serves as a tracking device.

BACKGROUND

Rechargeable batteries are used in many applications, for example as backup power for electrical powered systems or as the power source for motorized vehicles and machinery. For example telephone switchboards or cellular telephone networks may be powered by a wired electricity network from an electricity provider but may have multiple rechargeable batteries in a power cabinet to keep the switchboard or network functioning in case of power failure.

Generally rechargeable batteries are expensive and many criminals specialize in stealing rechargeable batteries. Battery theft leads to great economic loss to companies that rely on rechargeable batteries. To prevent theft the companies generally invest a lot of money in employing security guards to protect vulnerable sights. However many cases were reported in which security guards were assaulted and batteries were stolen in spite of being protected.

To reduce economic loss, tracking devices may be attached to the batteries so that the batteries can be tracked down and recovered. This would render battery theft unfeasible. The tracking devices preferably should be concealed within the batteries so that the thieves cannot remove them without ruining the batteries. An external tracking device or installing a physical switch external to the battery to turn the tracking device on or off would defeat the purpose of the tracking device, since the thieves could turn off the tracking device.

Installing tracking devices in the field after deploying the battery would be expensive and could jeopardize the reliability of the battery. On the other hand a tracking device installed in a battery at the manufacturer would continuously require power even in a standby state, so that it would be available to be activated when necessary. Typically, the battery may spend many months in the manufacturer's warehouse, shipping warehouses and even at the client's warehouse until the battery is installed and activated. By that time the tracking device may have completely depleted the battery and the battery would arrive at the client in a deep discharge state, which may damage the battery.

SUMMARY

An aspect of an embodiment of the disclosure relates to a monitoring circuit that is installed within a rechargeable battery to protect the battery from illegal seizure after being installed in a consumer's system, for example in a battery cabinet to serve as a power backup for a cellular telephone station. The monitoring circuit is initially powered into a storage mode that consumes a minimal amount of current to enable the battery to last for many months without becoming depleted although the rechargeable battery is not connected to a power source and recharged. The monitoring circuit identifies when the battery is installed in a consumer system and automatically changes the mode of operation into a consumer mode in which it generally consumes a minimum amount of current and periodically performs two types of tasks, which consume more power. One task at a high frequency (e.g. every few minutes) includes recording the status of the battery in a memory. The second task at a lower frequency (e.g. once a day or once every few hours) includes communicating with a server to send the recorded information and receive commands from the server.

In consumer mode if an abnormal event is identified the monitoring circuit automatically changes the mode of operation into a movement mode in which the monitoring circuit continuously (e.g. every few minutes) communicates the location of the monitoring circuit to the server.

An abnormal event may include identifying from the status of the battery (e.g. based on sensors in the monitoring circuit):

1. That the battery was disconnected from the battery cabinet or a consumer device and is not receiving power or providing power;
2. That the battery was disconnected for longer than a specific amount of time;
3. That the battery was disconnected and is in motion or vibrating.
4. That the battery departed from a preselected geographical region;

Or violation of other predefined conditions, which may indicate that the security of the rechargeable battery was jeopardized.

In an exemplary embodiment of the disclosure, the server may notify a system administrator that an abnormal event occurred and accept feedback from the administrator to cancel the event or confirm the event. Optionally, if the administrator cancels the event the server may reset the function mode of the monitoring circuit to storage mode or consumer mode.

There is thus provided according to an exemplary embodiment of the disclosure, a monitoring circuit configured to be installed within a rechargeable battery, comprising:

A processor configured to control functionality of the monitoring circuit;

A memory configured to store status information sampled from the rechargeable battery by the monitoring circuit;

A global positioning system chip configured to determine a location of the monitoring circuit;

A wireless transceiver configured to communicate with a server wirelessly;

A sensor configured to monitor electrical power provided to the rechargeable battery or provided by the rechargeable battery;

Wherein the monitoring circuit is initially configured to function in a storage mode and consume minimal current;

Wherein the monitoring circuit in storage mode is configured to identify if the rechargeable battery is deployed in a consumer system and has started to be charged or provide charge to external devices, then the monitoring circuit changes to a consumer mode in which the monitoring circuit samples the status of the rechargeable battery based on the sensor and/or the global positioning system chip, records information of sampling the status in the memory and periodically communicates with a server to transmit the recorded information and receive instructions from the server;

Wherein in consumer mode if the processor identifies an abnormal event the monitoring circuit changes to function in a movement mode in which it continuously communicates the location of the monitoring circuit to the server.

In an exemplary embodiment of the disclosure, in storage mode the monitoring circuit periodically tests the voltage line or current line of the rechargeable battery to identify if the rechargeable battery is deployed in a consumer system. Optionally, in consumer mode the monitoring circuit samples the status of the rechargeable battery periodically at a higher frequency than the frequency of periodically communicating with the server. In an exemplary embodiment of the disclosure, the monitoring circuit is configured to increase or reduce the frequency of periodically communicating with the server responsive to instructions received from the server. Optionally, the monitoring circuit is configured to increase or reduce the frequency of sampling the status of the rechargeable battery responsive to instructions received from the server. In an exemplary embodiment of the disclosure, the monitoring circuit includes a temperature sensor and the status of the rechargeable battery includes temperature measurements of the rechargeable battery. Optionally, the monitoring circuit includes a resistance sensor and the status of the rechargeable battery includes internal resistance of the rechargeable battery. In an exemplary embodiment of the disclosure, the abnormal event includes identifying that the monitoring circuit departed from a predefined geographical region. Optionally, the abnormal event includes identifying that the rechargeable battery is disconnected from an external power source and from an external load for more than a preselected time. In an exemplary embodiment of the disclosure, the abnormal event includes identifying that the rechargeable battery is disconnected from an external power source and from an external load and the monitoring circuit is in motion. Optionally, the monitoring circuit returns to storage mode responsive to an instruction from the server. In an exemplary embodiment of the disclosure, the monitoring circuit in movement mode increases or reduces a frequency of communicating the location with the server based on instructions from the server.

There is further provided according to an exemplary embodiment of the disclosure, a method of tracking a rechargeable battery, comprising:

Installing a monitoring circuit with a processor and memory within the rechargeable battery;

Consuming minimal current by the monitoring circuit in a storage mode;

Changing to a consumer mode if identifying that the rechargeable battery is deployed in a consumer system and has started to be charged or provide charge to external devices;

In consumer mode sampling the status of the rechargeable battery with a sensor configured to monitor electrical power provided to the rechargeable battery or provided by the rechargeable battery and/or with a global positioning system chip configured to determine a location of the monitoring circuit;

Recording information of sampling the status in the memory of the monitoring circuit;

Periodically communicating using a transceiver in the monitoring circuit with a server to transmit the recorded information and receive instructions from the server;

Wherein in consumer mode if the processor identifies an abnormal event the monitoring circuit changes to function in a movement mode in which it continuously communicates the location of the monitoring circuit to the server.

BRIEF DESCRIPTION OF THE DRAWINGS

The present disclosure will be understood and better appreciated from the following detailed description taken in conjunction with the drawings. Identical structures, elements or parts, which appear in more than one figure, are generally labeled with the same or similar number in all the figures in which they appear, wherein.

and

Figure 3:
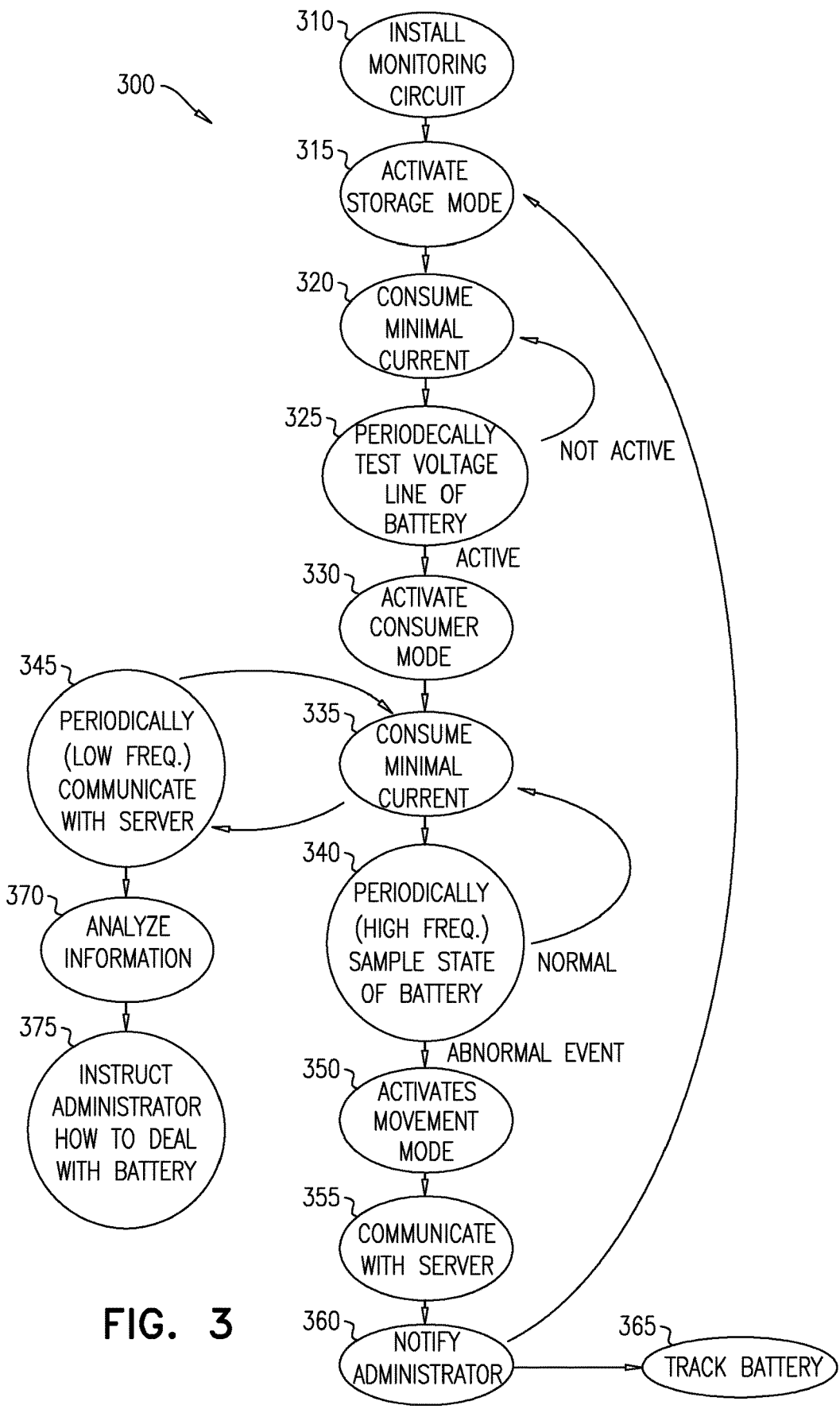

FIG. 3 is a flow diagram of a method of tracking rechargeable batteries, according to an exemplary embodiment of the disclosure.

DETAILED DESCRIPTION

Figure 1:
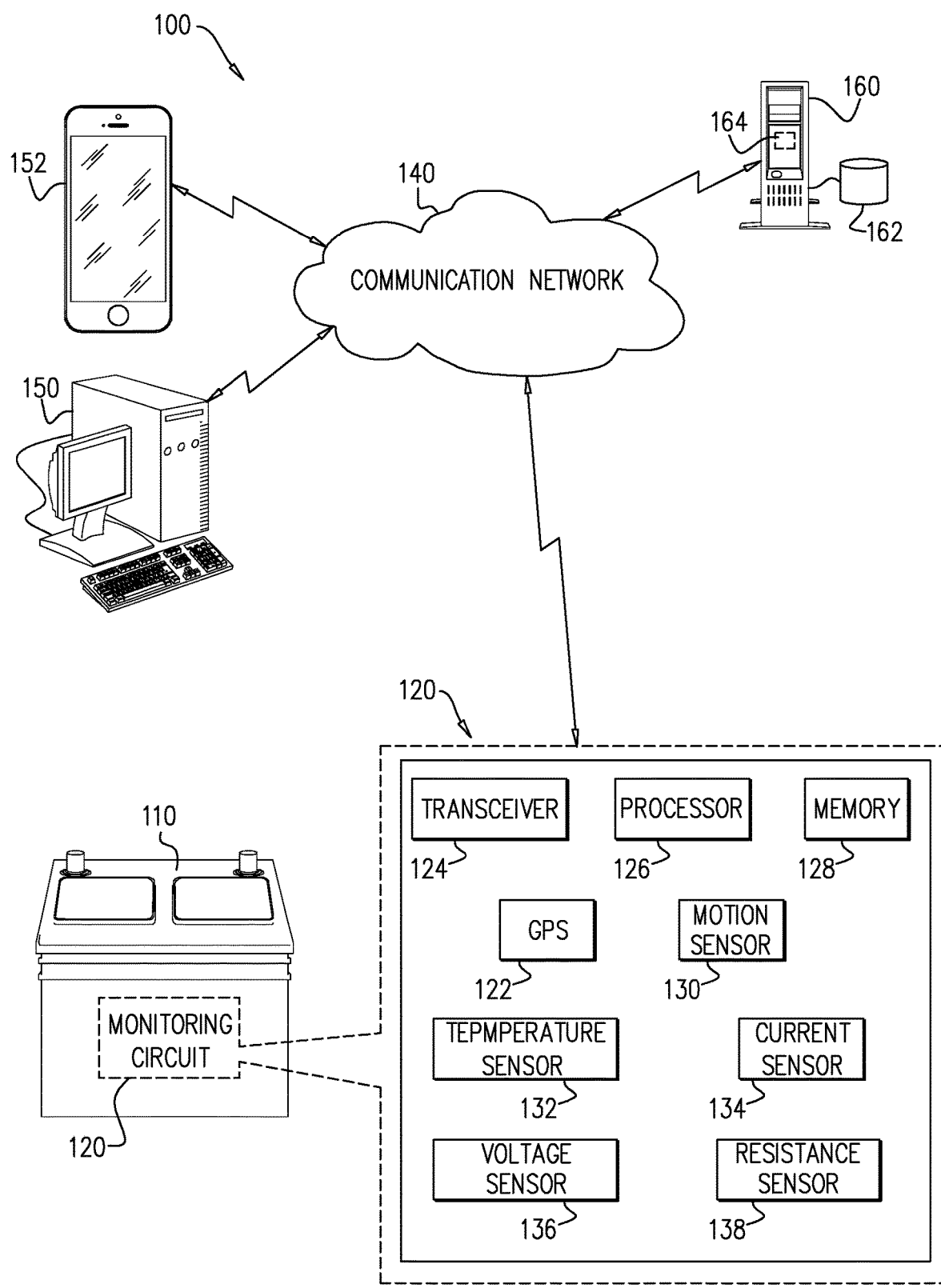
FIG. 1 is a schematic illustration of a system including a rechargeable battery with a monitoring circuit, according to an exemplary embodiment of the disclosure.

FIG. 1 is a schematic illustration of a system 100 including a computerized server 160 and a rechargeable battery 110 with a monitoring circuit 120, according to an exemplary embodiment of the disclosure. In an exemplary embodiment of the disclosure, the monitoring circuit 120 is initially installed within the rechargeable battery 110 during manufacture of the rechargeable battery 110. Optionally, the monitoring circuit 120 includes a processor 126 and memory 128 to control functionality of the monitoring circuit 120. Optionally, the processor is programmed to identify the operation mode of the monitoring circuit 120 and to automatically change modes responsive to measurements from sensors embedded in the monitoring circuit 120.

In an exemplary embodiment of the disclosure, the monitoring circuit includes a global positioning system (GPS) chip 122 to identify the location of the monitoring circuit 120 and a wireless transceiver 124 to communicate with server 160 over a communication network 140. Optionally, the wireless transceiver 124 may communicate over a cellular network (e.g. using CDMA, GSM and/or LTE protocols), RF networks or other types of wireless communication networks.

In an exemplary embodiment of the disclosure, monitoring circuit 120 includes a motion sensor 130 (e.g. a magnetometer, accelerometer, gyroscope) to identify motion or vibrations of the rechargeable battery 110. Additionally, the monitoring circuit 120 may include a temperature sensor 132 to sense the conditions in which the battery is functioning and which may affect the time required to recharge the battery. Further additionally, the battery may include a current sensor 134, a voltage sensor 136 and/or a resistance sensor 138 to evaluate the power consumption status of the battery.

Figure 2:
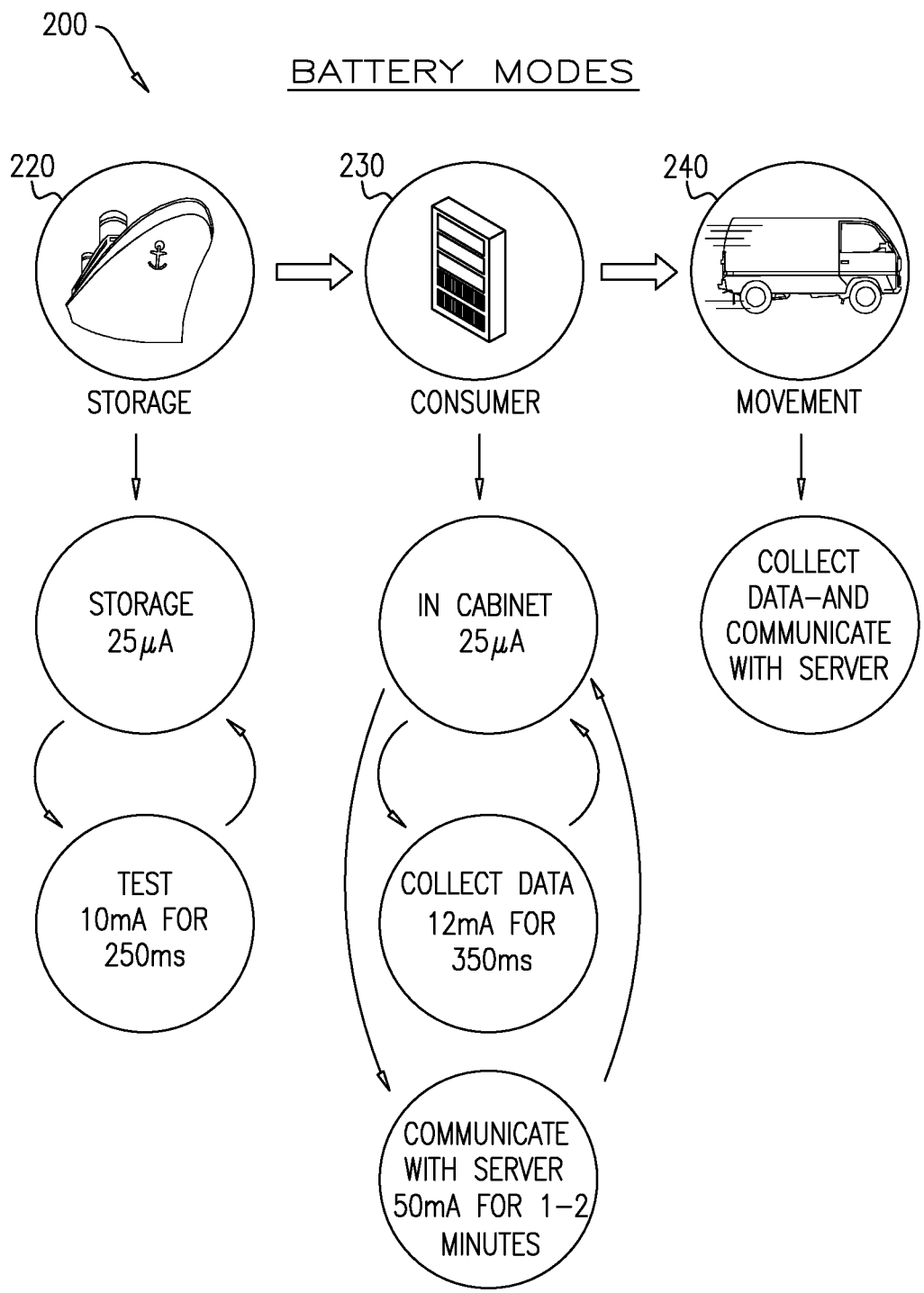
FIG. 2 is a schematic illustration of operation modes of the monitoring circuit, according to an exemplary embodiment of the disclosure.

FIG. 2 is a schematic illustration of operation modes 200 of the monitoring circuit 120, according to an exemplary embodiment of the disclosure. In an exemplary embodiment of the disclosure, the monitoring circuit 120 is in one of the following modes 200:

1. Storage mode 220—wherein the battery 110 is being shipped to the consumer, the monitoring circuit 120 is initially powered up and consumes a minimal amount of current, for example about 25 µA. Optionally, periodically (e.g. every few minutes) the monitoring circuit 120 tests the battery 110 consuming a larger amount of current (e.g. 10 mA) for a short period (e.g. 250 ms) to determine if the battery 110 is receiving power or providing power (e.g. being charged or discharged) to determine if the monitoring circuit 120 should remain in storage mode 220 or change modes.

2. Consumer mode 230—wherein the battery 110 is installed at the consumer (e.g. as part of a power backup cabinet). In this mode monitoring circuit 120 is mainly waiting and consumes a minimal amount of current, for example about 25 µA while waiting, however periodically (e.g. every few minutes) monitoring circuit 120 samples the status of the battery 110. Optionally, the status information may include: the ID of the battery, the time, the temperature, the internal resistance of the battery, the charge level, output voltage, if the battery is being charged or providing charge, the location of the battery 110 or other information. In an exemplary embodiment of the disclosure, monitoring circuit 120 stores the information in memory 128 for transmitting to server 160 at a later time. In an exemplary embodiment of the disclosure, sampling consumes a lot more power than waiting (e.g. about 12 mA for about 350 ms). Optionally, periodically (e.g. once a day or every few hours) monitoring circuit 120 communicates with server 160 to relay the stored information including identification of the battery 110 (e.g. a unique battery identifier), so that the server can monitor usage of the battery (e.g. including charging and discharging of the battery). In an exemplary embodiment of the disclosure, communicating may consume about 50 mA for about 1-2 minutes. Optionally, while communicating the server receives the information from the monitoring circuit 120 and can provide instructions to the monitoring circuit 120, for example to increase/decrease the sampling frequency or increase/decrease the period for communicating with the server. In some embodiments of the disclosure, server 160 provides notifications to a system administrator in charge of handling battery 110, for example to immediately discharge or charge the battery or to schedule maintenance at a specific time (e.g. charging or discharging at a specific time). Optionally, the administrator may have a computer 150 or smartphone 152 or other communication device to receive the notifications from the server 160. Server 160 may send the administrator an email, SMS or other type of message. In an exemplary embodiment of the disclosure, server 160 stores the status information received from batteries 110 in a database 162 and employs an analysis program 164 to analyze the status information.

3. Movement mode 240—if during sampling in consumer mode 230 the monitoring circuit 120 determines that an event occurred, for example the battery is disconnected from the wired power source, is in motion, the battery moved out of a specific geographic boundary, the battery is disconnected for more than a preselected amount of time, the battery is disconnected and in motion or other occurrences that do not match preprogrammed settings of the battery 110 then monitoring circuit 120 immediately communicates with server 160 and starts to continuously notify the server 160 of its location (e.g. based on the measurements of the GPS chip 122). Server 160 then notifies the system administrator by device 150 or 152 of the event. In an exemplary embodiment of the disclosure, monitoring circuit 120 continues to communicate with server 160 (e.g. every few minutes or seconds) as long as the battery can power the monitoring circuit (e.g. for about 1-7 days or more). Optionally, server 160 may instruct monitoring circuit 120 to increase or decrease the reporting rate. for example if the battery 110 is far away from a security force, server 160 may instruct the monitoring circuit 120 to reduce the commination frequency to prolong battery life, whereas when the security forces are near, server 160 may instruct monitoring circuit 120 to increase the communication rate. Optionally, if the battery 110 was intentionally removed by the system administrator, the system administrator may notify server 160 to notify monitoring circuit 120 to return to storage mode 220 as if it is being shipped and waiting for installation. Likewise the system administrator or server 160 may instruct monitoring circuit 120 to return to consumer mode 230 (e.g. if no real problem occurred—a false event).

FIG. 3 is a flow diagram of a method 300 of tracking rechargeable batteries 110, according to an exemplary embodiment of the disclosure. In an exemplary embodiment of the disclosure, the monitoring circuit 120 is installed (310) in battery 110. The monitoring circuit 120 activates (315) storage mode 220 for marketing the battery 110 and shipping the battery 110 to a consumer. In storage mode 220 the battery is programmed to consume (320) minimal current (e.g. to have processor 126 execute a timer or counter to decide when to perform actions). Periodically the monitoring circuit 120 tests (325) the voltage line of the battery 110 to determine if the battery has been installed in a consumer system and is activated. If not activated monitoring circuit 120 continues to consume minimal current to prolong the life of the battery 110. If activated monitoring circuit 120 activates (330) consumer mode 230 in which it is charged and discharged as needed to serve as part of the consumer system (e.g. a power backup system of a communication network).

In consumer mode 230 monitoring circuit 120 generally consumes minimal current (335) and periodically with a high frequency (e.g. every 5-10 minutes) samples (340) the state of the battery to record the activities and health of the battery. Optionally, the sampled information is recorded in memory 128 of battery 110. Additionally, periodically with a low frequency (e.g. once every 12 hours or once a day) monitoring circuit 120 communicates (345) with server 160 to provide the sampled information from memory 128 for analysis and to receive commands from the server 160.

In an exemplary embodiment of the disclosure, server 160 analyzes (370) the information in real-time and instructs the monitoring circuit 120 responsive to the sampled information that was provided, for example to increase or decrease the sampling rate or communication rate. Alternatively or additionally, server 160 analyzes (370) the sampled information and transmits instructions to the system administrator how to deal with the battery (375) to enhance the health of the battery 110, for example to charge the battery 110 at a specific time or refrain from charging the battery for a specific amount of time (e.g. to disconnect the charge power and wait another day until recharging the battery).

In an exemplary embodiment of the disclosure, when sampling (340) the state of the battery monitoring circuit 120 analyzes the sampled information to identify if the state is normal or if an abnormal event occurred, for example the battery 110 is disconnected from the power source, is disconnected from providing power to a consumer system, if the battery is in motion or if the battery exited or entered a predefined geographical region or a combination of the above. Optionally, if an abnormal event occurred monitoring circuit 120 activates (350) movement mode 240 in which the monitoring circuit begins to communicate (355) with the server at a high frequency, for example every 1-5 minutes. Optionally, the monitoring circuit 120 continuously retrieves location information from GPS chip 122 and transmits it to server 160.

In an exemplary embodiment of the disclosure, server 160 notifies (360) the system administrator to check the physical location of the system where the battery was installed to confirm if the battery 110 was stolen or if it was removed for maintenance or monitoring circuit 120 gave notification for other reasons. Accordingly, the system administrator may instruct the server 160 to reset the operation mode of the monitoring circuit 120, for example back to activate (315)

storage mode 220, for example in a case that the battery was disconnected for shipping to a different location. Alternatively, the system administrator may request to reset monitoring circuit 120 back to consumer mode 230, in case of a false alarm. Further alternatively, if the battery was stolen, the system administrator may track the battery (365) to repossess it with the help of security forces.

In an exemplary embodiment of the disclosure, server 160 transfers the location information from monitoring circuit 120 to the system administrator devices (150, 152) or enables the administrator devices (150, 152) to access the information, for example by an application that receives data from the server, so that the battery 110 may be located by the system administrator and/or law enforcement forces. In some embodiments of the disclosure, server 160 may provide instructions to monitoring circuit 120, for example to increase or decrease the frequency for communicating with the server 160 or to change modes of operation.

In an exemplary embodiment of the disclosure, program 164 may be programmed to allow the administrator devices (150, 152) to connect over network 140 and execute an application that provides a map showing the path taken by the battery 110 and the current location of the battery 110.

It should be appreciated that the above described methods and apparatus may be varied in many ways, including omitting or adding steps, changing the order of steps and the type of devices used. It should be appreciated that different features may be combined in different ways. In particular, not all the features shown above in a particular embodiment are necessary in every embodiment of the disclosure. Further combinations of the above features are also considered to be within the scope of some embodiments of the disclosure. It will also be appreciated by persons skilled in the art that the present disclosure is not limited to what has been particularly shown and described hereinabove.

I claim:

1. A monitoring circuit configured to be installed with a rechargeable battery, comprising:
   a processor configured to control functionality of the monitoring circuit;
   a memory configured to store status information sampled from the rechargeable battery by the monitoring circuit; and
   a global positioning system chip configured to determine a location of the monitoring circuit
   a wireless transceiver configured to communicate with a server wirelessly;
   a sensor configured to monitor the rechargeable battery,
   wherein the monitoring circuit is configured to function in a storage mode comprising consuming minimal current by only performing the function of periodically testing the rechargeable battery to determine if the rechargeable battery is deployed in a consumer system and has started to be charged or provide charge to external devices;
   wherein in the storage mode if the monitoring circuit identifies that the rechargeable battery has started to be charged or provide charge to external devices, then the monitoring circuit automatically changes from the storage mode to a consumer mode;
   wherein in the consumer mode the monitoring circuit consumes more than the minimal current by performing the functions of sampling the status of the rechargeable battery based on the sensor, recording the information of the sampled-status in the memory periodically communicating with the server to transmit the recorded information, receiving instructions from the server, or any combination thereof
   wherein in the consumer mode if the processor identifies an abnormal event the monitoring circuit changes to a movement mode in which it continuously communicates the location of the monitoring circuit to the server
   wherein the server analyzes the sampled-status from the monitoring circuit of the rechargeable battery, provides an instruction to a communication device of an administrator in charge of handling the rechargeable battery, and changes a mode of the monitoring circuit based on the analyzed sampled battery status.

2. The monitoring circuit of claim 1, wherein in storage mode the monitoring circuit periodically tests the voltage line or current line of the rechargeable battery to identify if the rechargeable battery is deployed in a consumer system.

3. The monitoring circuit of claim 1, wherein in consumer mode the monitoring circuit samples the status of the rechargeable battery periodically at a higher frequency than the frequency of periodically communicating with the server.

4. The monitoring circuit of claim 3, wherein the monitoring circuit is configured to increase or reduce the frequency of periodically communicating with the server responsive to instructions received from the server.

5. The monitoring circuit of claim 3, wherein the monitoring circuit is configured to increase or reduce the frequency of sampling the status of the rechargeable battery responsive to instructions received from the server.

6. The monitoring circuit of claim 1, wherein the monitoring circuit includes a temperature sensor and the status of the rechargeable battery includes temperature measurements of the rechargeable battery.

7. The monitoring circuit of claim 1, wherein the monitoring circuit includes a resistance sensor and the status of the rechargeable battery includes internal resistance of the rechargeable battery.

8. The monitoring circuit of claim 1, wherein the abnormal event includes identifying that the monitoring circuit departed from a predefined geographical region.

9. The monitoring circuit of claim 1, wherein the abnormal event includes identifying that the rechargeable battery is disconnected from an external power source and from an external load for more than a preselected time.

10. The monitoring circuit of claim 1, wherein the abnormal event includes identifying that the rechargeable battery is disconnected from an external power source and from an external load and the monitoring circuit is in motion.

11. The monitoring circuit of claim 1, wherein the monitoring circuit returns to storage mode responsive to an instruction from the server.

12. The monitoring circuit of claim 1, wherein the monitoring circuit in movement mode increases or reduces a frequency of communicating the location with the server based on instructions from the server.

13. A method of tracking a rechargeable battery, comprising:
   operating, by a processor, a monitoring circuit coupled to the rechargeable battery in a storage mode, wherein in the storage mode the monitoring circuit only performs the function of periodically testing the rechargeable battery to determine if the rechargeable battery is deployed in a consumer system and has started to be charged or provide charge to external devices;
   automatically changing, by the processor, the monitoring circuit to a consumer mode if it is identified that the rechargeable battery is deployed in a consumer system and has started to be charged or provide charge to external devices;

in consumer mode sampling, by the processor, the status of the rechargeable battery with a sensor configured to monitor electrical power provided to the rechargeable battery or provided by the rechargeable battery and/or with a global positioning system chip configured to determine a location of the monitoring circuit;

recording, by the processor, information of the sampled status in the memory of the monitoring circuit;

periodically, by the processor, communicating using a transceiver in the monitoring circuit with a server to transmit the recorded information and receive instructions from the server;

wherein in consumer mode if the processor identifies an abnormal event the monitoring circuit changes to a movement mode in which it continuously communicates the location of the monitoring circuit to the server changing, by the server, a mode of the monitoring circuit based on the analyzed sampled battery status.

14. The method of claim 13, wherein in consumer mode the monitoring circuit samples the status of the rechargeable battery periodically at a higher frequency than the frequency of periodically communicating with the server.

15. The method of claim 14, wherein the monitoring circuit is configured to increase or reduce the frequency of periodically communicating with the server responsive to instructions received from the server.

16. The method of claim 14, wherein the monitoring circuit is configured to increase or reduce the frequency of sampling the status of the rechargeable battery responsive to instructions received from the server.

17. The method of claim 13, wherein the monitoring circuit includes a resistance sensor and the status of the rechargeable battery includes internal resistance of the rechargeable battery.

18. The method of claim 13, wherein the abnormal event includes identifying that the monitoring circuit departed from a predefined geographical region.

19. The method of claim 13, wherein the abnormal event includes identifying that the rechargeable battery is disconnected from an external power source and from an external load for more than a preselected time.

20. The method of claim 13, wherein the abnormal event includes identifying that the rechargeable battery is disconnected from an external power source and from an external load and the monitoring circuit is in motion.

* * * * *